United States Patent
Han (10) Patent No.: US 7,148,132 B2
(45) Date of Patent: Dec. 12, 2006

(54) MANUFACTURING METHOD OF SEMICONDUCTOR DEVICE

(75) Inventor: Jae-Won Han, Bucheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 36 days.

(21) Appl. No.: 11/024,610

(22) Filed: Dec. 30, 2004

(65) Prior Publication Data

US 2005/0142822 A1  Jun. 30, 2005

(30) Foreign Application Priority Data

Dec. 31, 2003 (KR) ............ 10-2003-0101917

(51) Int. Cl.
*H01L 21/3205* (2006.01)

(52) U.S. Cl. .................................... 438/592

(58) Field of Classification Search ........ 438/592, 438/595, 651, 653, 655, 660, 663, 664, 682
See application file for complete search history.

(56) References Cited

U.S. PATENT DOCUMENTS 5,970,370 A * 10/1999 Besser et al. ............ 438/586
6,333,262 B1 * 12/2001 Tseng et al. ............ 438/664
6,346,477 B1   2/2002 Kaloyeros et al.

* cited by examiner

*Primary Examiner*—Quoc Hoang
(74) *Attorney, Agent, or Firm*—Mayer, Brown, Rowe & Maw LLP (57) ABSTRACT

A method of manufacturing a semiconductor device. A cobalt film is formed on a wafer including gate, source, and drain regions. An initial protection metal film is formed with an initial amount of a protection metal film material on the cobalt film. The wafer is thermally treated to form a cobalt silicide film. An additional protection metal film is formed with an additional amount of the protection metal film material.

18 Claims, 6 Drawing Sheets

MANUFACTURING METHOD OF SEMICONDUCTOR DEVICE

BACKGROUND OF THE INVENTION (a) Field of the Invention

The present invention relates to a method of manufacturing a semiconductor device including a gate electrode to which cobalt silicide is applied.

(b) Discussion of the Related Art

The performance of a transistor in a semiconductor device is related to a combination of speed, driving current, leakage current, etc. Thus, to enhance the transistor performance by increasing speed while decreasing leakage current, attempts have been made to reduce resistance of source and drain regions or a gate electrode.

A known method used to reduce the resistance of these regions is to form a metal silicide layer overlying surfaces of source and drain regions or an upper surface of a gate electrode. Cobalt silicide is used as the metal silicide, as cobalt silicide provides favorable leakage current and resistance properties.

In a known gate electrode formation process, cobalt is deposited on a silicon wafer having a predetermined gate electrode and source and drain electrodes. A cobalt film is formed on surfaces of the source and drain electrodes and an upper surface of the gate electrode. Then, a protection metal film is formed on the cobalt film using titanium (Ti) or titanium nitride (TiN), etc. Next, a thermal treatment is performed to form a cobalt silicide film by a reaction of cobalt and silicon. The protection metal film is to prevent a surface of the cobalt film from being nitrified, the cobalt from being silicified too quickly, or the cobalt silicide film from being formed with too great a thickness.

However, when the protection metal film is erroneously or abnormally formed relatively thin as compared to a predetermined thickness, the cobalt silicide film is formed too thick on a portion of the surface of the gate electrode or a portion of the surfaces of the source and drain regions. In such a case, a moat resistance and a resistance of polysilicide decrease, and an RC delay constant falls outside of a predetermined condition, such that the semiconductor device does not function optimally. Further, the diode leakage current increases, so that operation of the device may be precluded. Thus, the wafer is disposed of when the protection metal film has a thickness less than the predetermined thickness.

SUMMARY OF THE INVENTION

To address the above-described and other problems, it is an object of the present invention to provide a method of manufacturing a semiconductor device. A cobalt film is formed on a wafer including gate, source, and drain regions. An initial protection metal film is formed with an initial amount of a protection metal film material on the cobalt film. The wafer is thermally treated to form a cobalt silicide film. An additional protection metal film is formed with an additional amount of the protection metal film material.

It is to be understood that both the foregoing general description of the invention and the following detailed description are exemplary, but are not restrictive of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

Embodiments of the present invention are described with reference to the accompanying drawings. It is to be understood that the invention is not limited to the disclosed embodiments, but rather is intended to cover various modifications and arrangements within the scope of the claims. The same reference numbers are used throughout the drawings to refer to the same or like parts.

In the drawings, the thicknesses of layers, films, and regions are exaggerated for clarity. It is to be understood that when an element such as a layer, film, region, or substrate is described as "on" another element, the layer, film, region, or substrate can be disposed directly on the another element, or one or more additional elements may be disposed therebetween.

Figure 1:
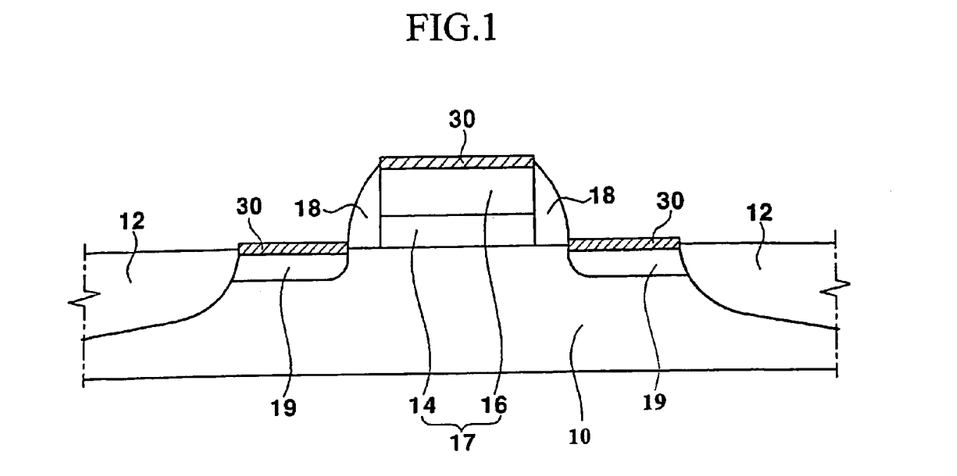
FIG. 1 is a schematic cross-sectional view of a semiconductor device according to the present invention.

FIG. 1 is a schematic cross-sectional view of a semiconductor device according to the present invention. As shown in FIG. 1, a pair of device isolation regions 12 is formed on a wafer 10, such as a silicon wafer, to define an active region. A gate oxide film 14 is formed on the partial active region, and a gate poly film 16 is formed on the gate oxide film 14.

Gate spacers 18, which are made of an insulating material, are formed on each sidewall of the gate poly film 16. Source and drain regions 19 are formed in the wafer 10, each externally extending from the surface of the gate spacers 18 centering the gate poly film 16. N-type or P-type impurities are highly doped in the source and drain regions 19.

Silicide film 30 is formed on the gate poly film 16 and source and drain regions 19. Cobalt (Co) is preferably used as a silicide material of the silicide films 30. The silicide films 30 reduce a contact surface resistance when contacting a metal wire or a poly-silicon wire in subsequent processing steps.

Figure 2A:
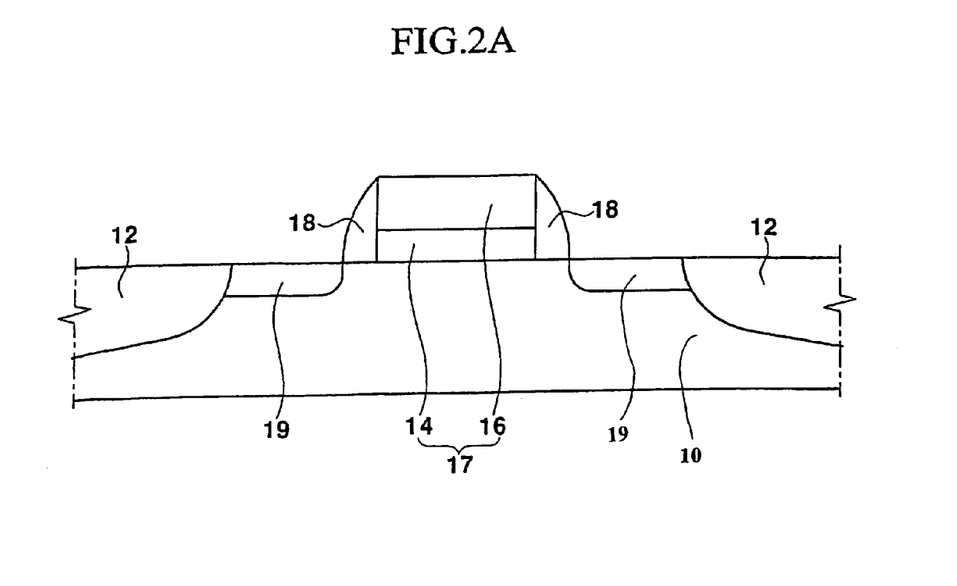
FIGS. 2A through 2C are schematic cross-sectional views showing a method of manufacturing a semiconductor device according to the present invention.
Figure 2B:
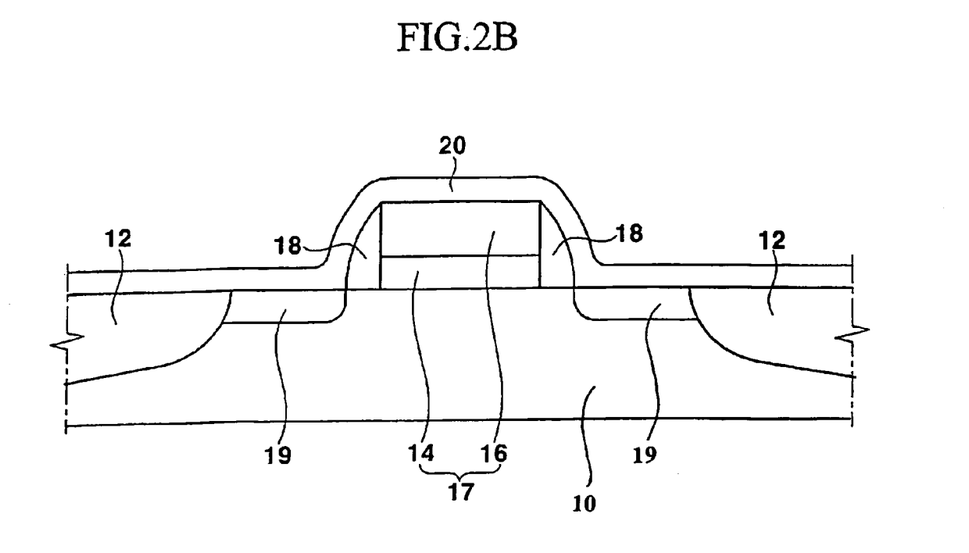
Figure 2C:
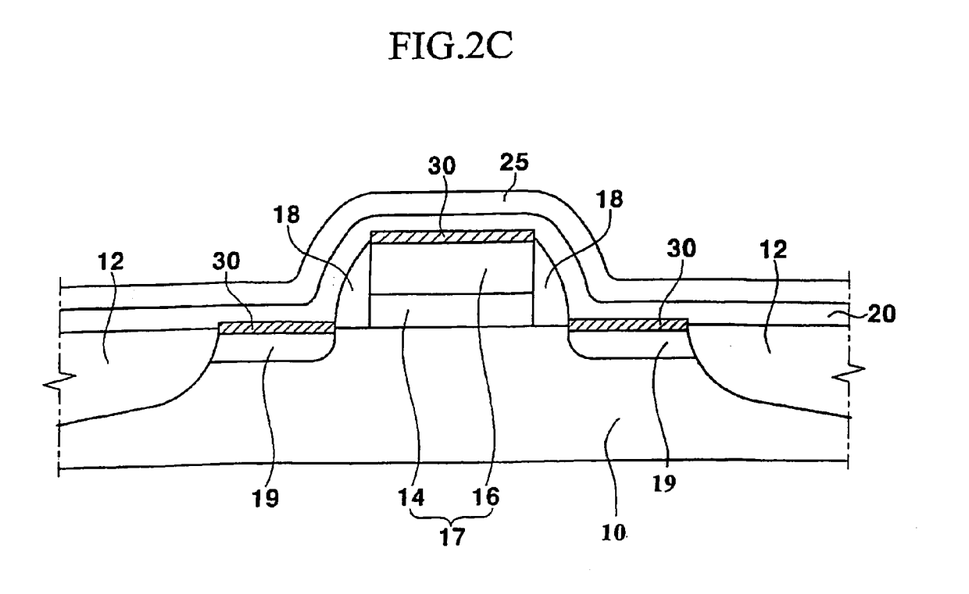

FIGS. 2A through 2C are schematic cross-sectional views showing a method of manufacturing a semiconductor device according to the present invention. As shown in FIG. 2A, a pair of device isolation regions 12 is first formed on a silicon wafer 10 to define an active region. An oxide film and a poly silicon film are successively deposited on the wafer 10 and patterned by a photoetching process using a mask to form a gate 17 including a gate poly film 16 and a gate oxide film 14 on the active region. Gate spacers 18 are formed on each sidewall of the gate poly film 16 by depositing silicon nitride (SiNx) film on the entire wafer 10 to cover the gate poly film 16, and back-etching the deposited silicon nitride film.

An oxide film is deposited on the entire wafer 10 and is patterned to form a cap oxide film (not shown) capable of protecting the gate poly film 16. Source and drain regions 19 are formed by doping conductive impurity ions to the active region using the cap oxide film as a mask. The implanted ions are either N-type or P-type impurities, for example, phosphorous (P), boron (B), etc. It is to be understood that LDD regions (not shown) can be also formed prior to the formation of the gate spacers 18, even if the source and drain regions are only formed in the above-mentioned process.

As shown in FIG. 2B, cobalt (Co) is deposited on the entire wafer 10 to form a Co film 20. The formation of the Co film 20 can be completed with physical vapor deposition (PVC) and chemical vapor deposition (CVD). FIG. 2C shows a protection metal film 25 formed over the plasma treated cobalt film 20 to protect the cobalt film 20. The protection metal film 25 is preferably formed through PVD or CVD of Ti, TiN, or a complex material such as Ti/TiN.

During the formation of the protection metal film 25, when the process is abnormally performed, additional deposition of the protection metal film 25 can be subsequently performed, as described below.

Figure 3:
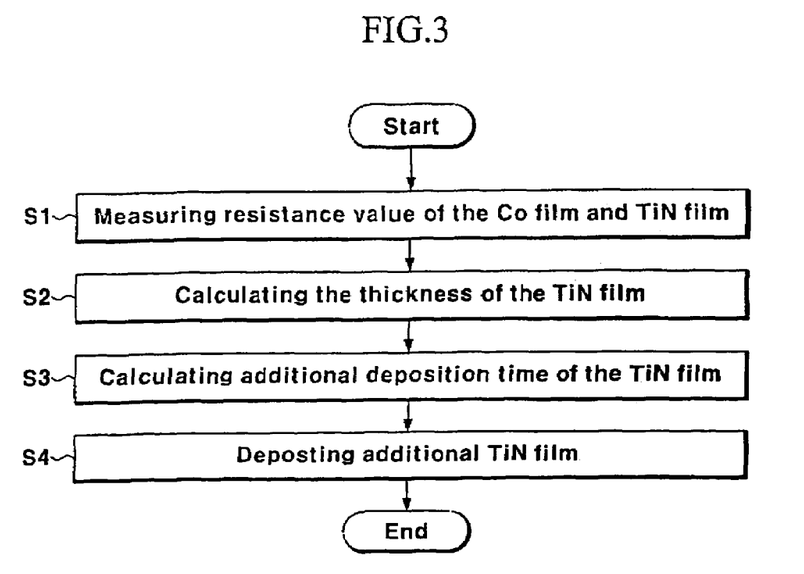
FIG. 3 is a flowchart showing additional deposition of a TiN layer during the manufacture of a semiconductor device according to the present invention.

FIG. 3 is a flowchart showing additional deposition of the protection metal film during the manufacture of a semiconductor device according to the present invention. For example, in a case when an error occurs during deposition of TiN to form the protection metal film 25, a vacuum condition in the deposition chamber is cancelled. The wafer is removed to measure resistance values of the Co film 20 and the TiN film (S1).

Then, the resistance of the TiN film is determined by the following equation.

$$\frac{1}{R_{total}} = \frac{1}{R_{Co}} + \frac{1}{R_{TiN}}$$

where $R_{total}$ is a total value of two resistances connected serially, $R_{Co}$ is a resistance of the Co film and $R_{TiN}$ is a resistance of the TiN film.

Here, the $R_{total}$ is determined through the measurement and the $R_{Co}$ can be estimated based on a predetermined thickness of the Co film. Accordingly, the $R_{TiN}$ can be calculated based on the $R_{total}$ and $R_{Co}$.

A thickness of the deposited TiN film is calculated through a calculated value of $R_{TiN}$ and a value of non-resistance of TiN (S2).

By subtracting the thickness of the TiN film obtained from S2 from the predetermined thickness of the TiN film, a thickness of the TiN film to be additionally deposited is determined. Further, if it is assumed that the thickness of the TiN film is linearly proportional to the deposition time of the TiN film, additional deposition time of the TiN film is obtained through the following proportion equation (S3).

A predetermined deposition thickness : a thickness to be deposited additionally = a predetermined deposition time : additional deposition time.

The wafer 10 receiving additional TiN deposition is disposed in a chamber during deposition of the Co film 20. It is to be understood that TiN deposition can be performed under the same conditions as the predetermined deposition conditions of the Co film 20. The wafer is transferred to a TiN deposition chamber and additional TiN deposition is performed for the calculated deposition time (S4).

The above steps S1 through S4 are advantageous in that the protection metal film 25 is formed to have the predetermined thickness, regardless of whether an error occurs in the deposition process of the protection metal film 25. Accordingly, wafers are not wasted due to incorrect deposition of the protection metal film 25.

A first thermal treatment is performed to form a Co silicide film 30 on the gate poly film 16. At this time, problems do not occur even if a natural oxide film remains, since Co atoms are sufficiently deposited over the surfaces of the source and drain regions 19 and the gate poly film 16. Restated, the remaining natural oxide film does not act as a barrier when the Co silicide film 30 is formed.

For the first thermal treatment, either one of a rapid thermal process (RTP) or an electric furnace thermal process is preferably used. In the RTP, it is preferable that the process continues from about 10 seconds to about 60 seconds, while maintaining a temperature from about 300° C. to about 600° C. Alternately, in the electric furnace thermal process, it is preferable that the process continues from about 20 seconds to about 60 seconds, while maintaining a temperature from about 300° C. to about 600° C.

After the first thermal treatment, as shown in FIG. 1, the non-silicified Co film 20 and the protection metal film 25 are etched in an SPM solution at a temperature from about 50° C. to about 150° C., from about 5 minutes to about 15 minutes, and removed. Impurities generated in the etching process are cleaned in a SC1 solution for about 3 minutes to about 10 minutes. The SPM used is a solution including mixed hydrogen and sulfate having a proportion of about 1 to 6.

A second thermal treatment is performed to ensure stability of the Co silicide film 30. In the RTP, it is preferable that the process continues from about 10 seconds to about 60 seconds, while maintaining a temperature from about 800° C. to about 950° C. In the electric furnace thermal process, it is preferable that the process continues from about 20 seconds to about 60 seconds, while maintaining a temperature from about 500° C. to about 900° C.

Figure 4:
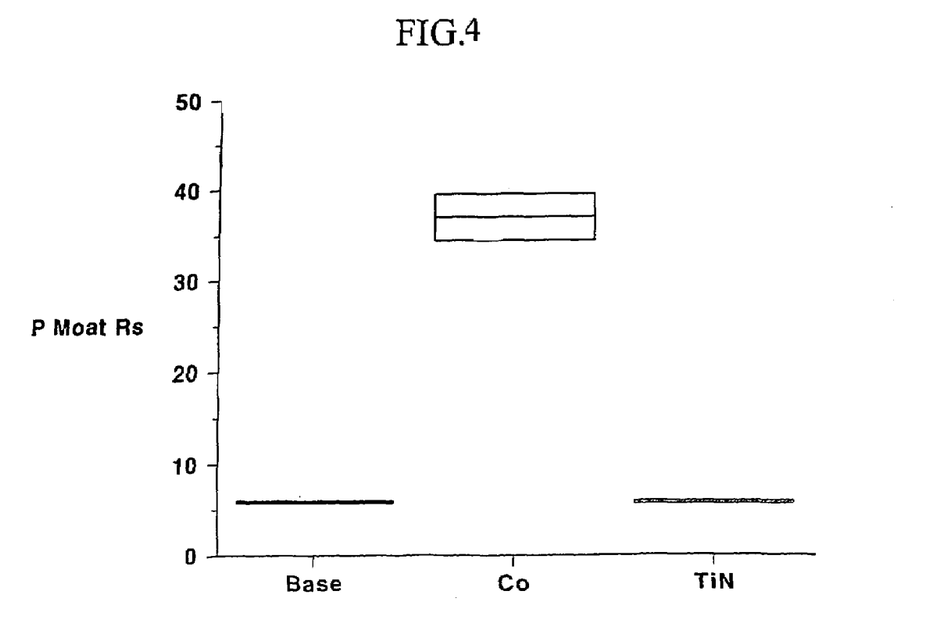
FIG. 4 is a graph comparing P-moat resistances of a semiconductor device including the additional TiN deposition according to the present invention with a known semiconductor device.
Figure 5:
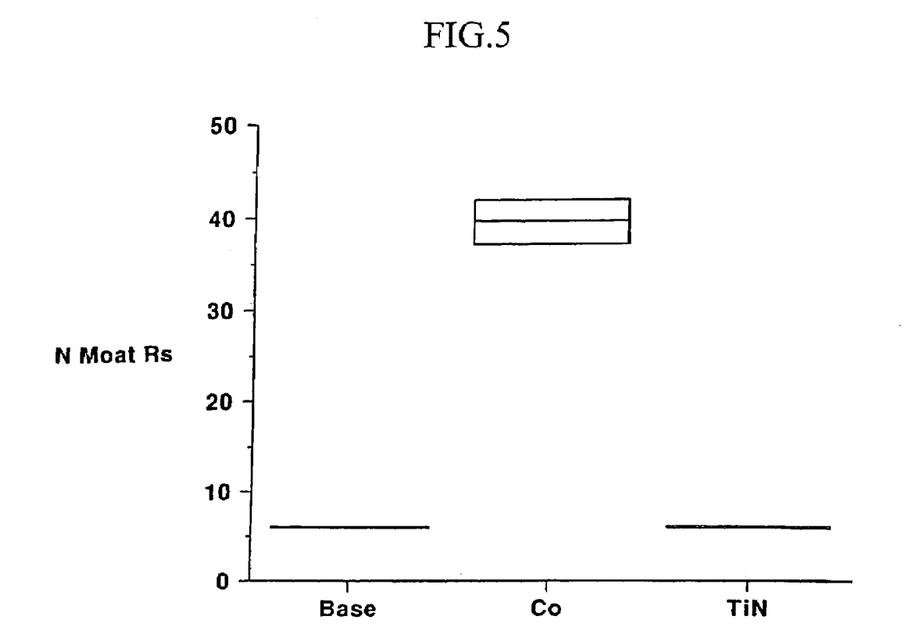
FIG. 5 is a graph comparing N-moat resistances of a semiconductor device including the additional TiN deposition according to the present invention with a known semiconductor device.
Figure 6:
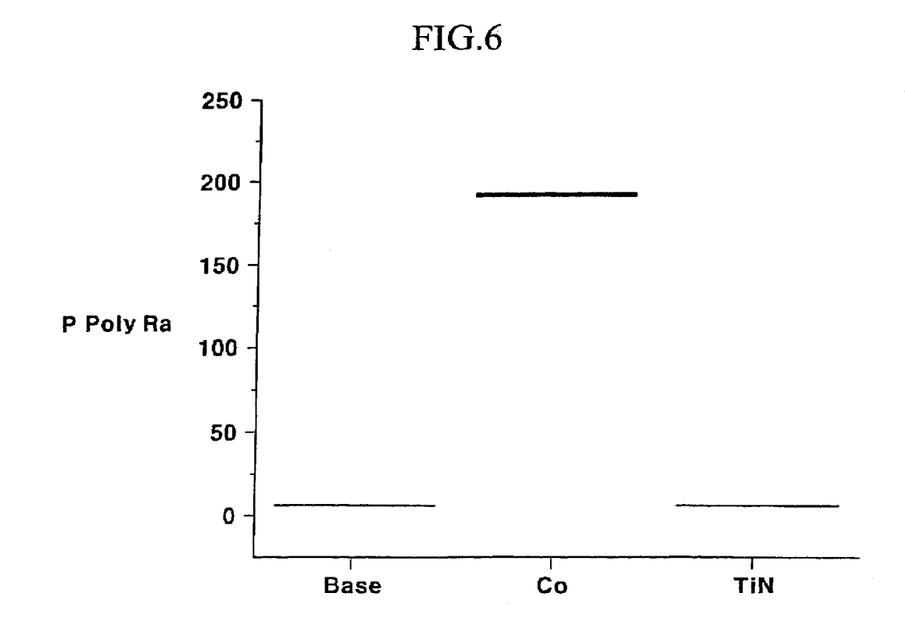
FIG. 6 is a graph comparing P-poly resistances of a semiconductor device including the additional TiN deposition according to the present invention with a known semiconductor device.
Figure 7:
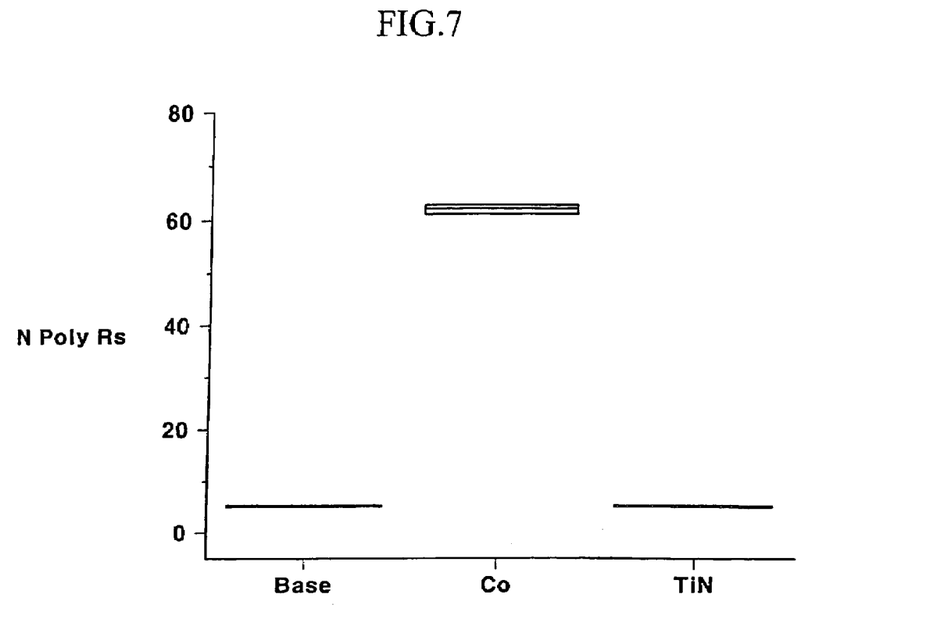
FIG. 7 is a graph comparing N-poly resistances of a semiconductor device including the additional TiN deposition according to the present invention with a known semiconductor device.

FIG. 4 is a graph comparing P-moat resistances of a semiconductor device including the additional TiN deposition according to the present invention with a known semiconductor device. FIG. 5 is a graph comparing N-moat resistances of a semiconductor device including the additional TiN deposition according to the present invention with a known semiconductor device. FIG. 6 is a graph comparing P-poly resistances of a semiconductor device including the additional TiN deposition according to the present invention with a known semiconductor device. FIG. 7 is a graph comparing N-poly resistances of a semiconductor device including the additional TiN deposition according to the present invention with a known semiconductor device.

As shown in FIGS. 4 through 7, it can be confirmed that the semiconductor device having the additionally deposited protection metal film 25 does not differ from a known semiconductor device with respect to N-moat and P-moat resistance and N-poly and P-poly resistance, each representing resistance of the silicide.

Figure 8:
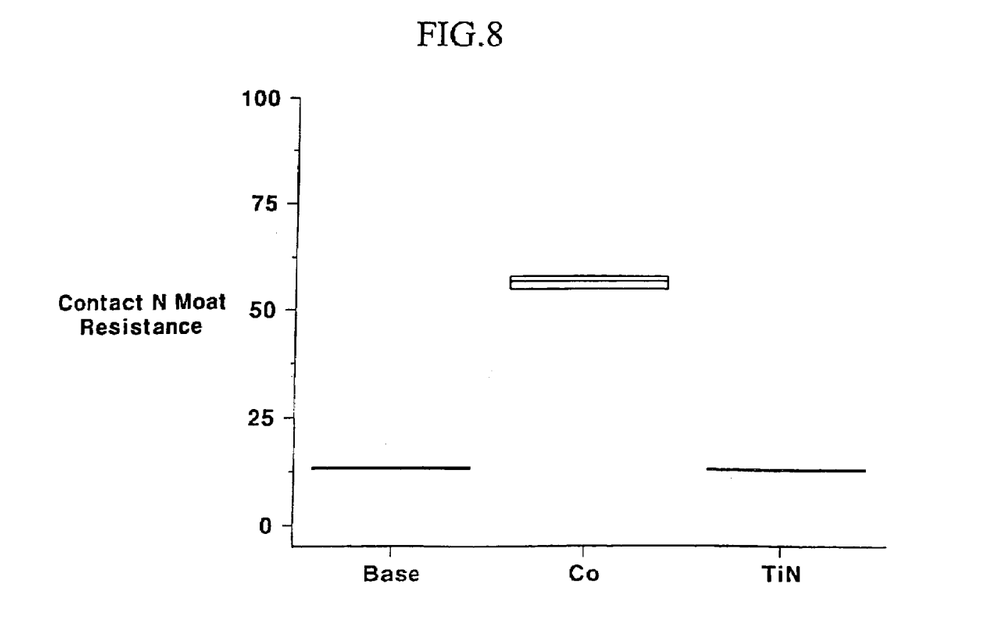
FIG. 8 is a graph comparing N-moat resistances of contact regions of a semiconductor device including the additional TiN deposition according to the present invention with a known semiconductor device.
Figure 9:
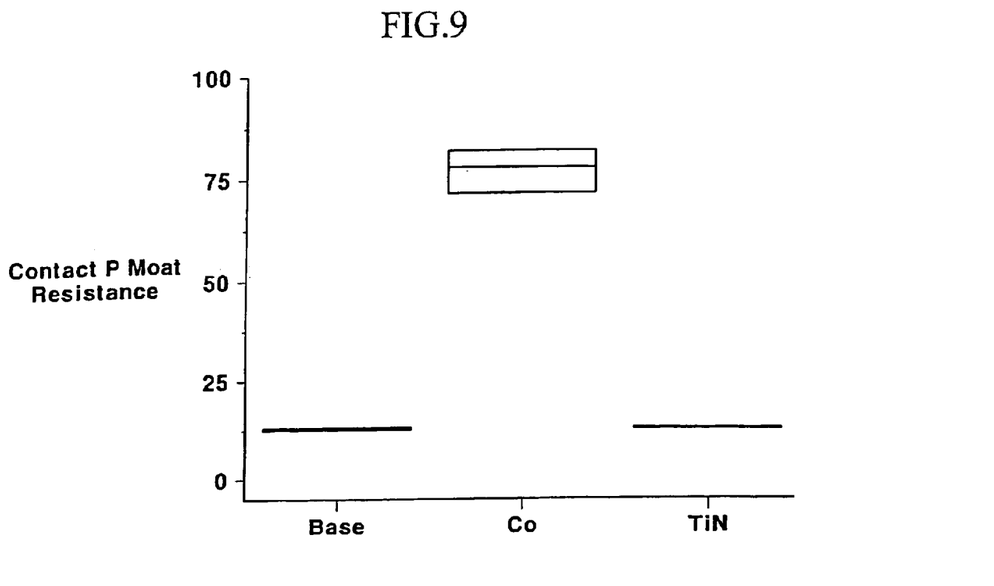
FIG. 9 is a graph comparing P-moat resistances of contact regions of a semiconductor device including the additional TiN deposition according to the present invention with a known semiconductor device.

FIG. 8 is a graph comparing N-moat resistances of contact regions of a semiconductor device including the additional TiN deposition according to the present invention with a known semiconductor device. FIG. 9 is a graph comparing P-moat resistances of contact regions of a semiconductor device including the additional TiN deposition according to the present invention with a known semiconductor device.

As shown in FIGS. 8 and 9, it can also be confirmed that there is no difference between a semiconductor device according to the present invention and a known semiconductor device with respect to a contact resistance degree.

Figure 10:
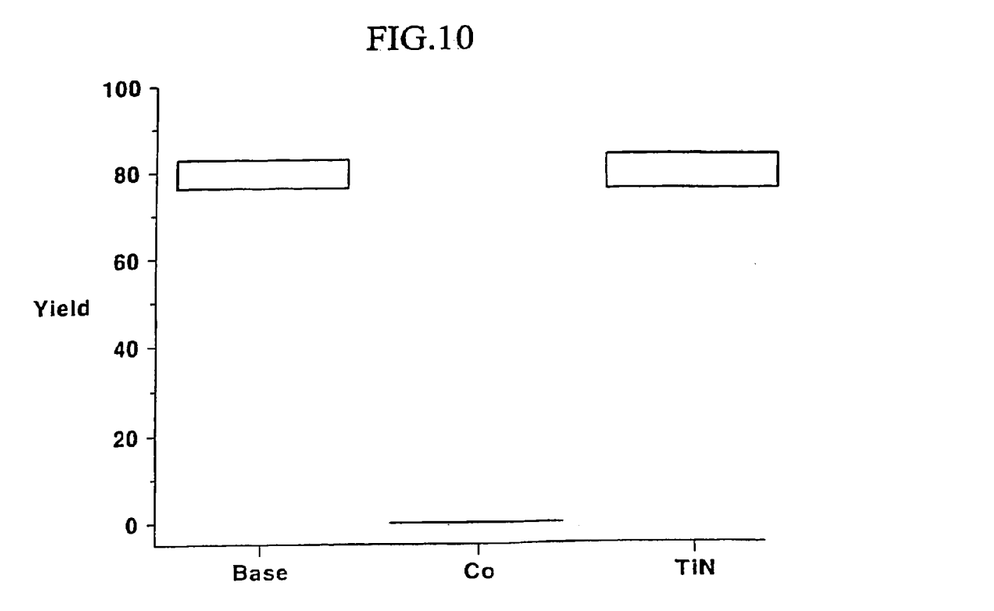
FIG. 10 is a graph comparing yields of a semiconductor device including the additional TiN deposition according to the present invention with a known semiconductor device.

FIG. 10 is a graph comparing yields of a semiconductor device including the additional TiN deposition according to the present invention with a known semiconductor device. As shown in the figure, it can be confirmed that there is no difference between a semiconductor according to the present invention and a known semiconductor device with respect to yield.

As discussed above, the present invention can provide a metal film formed to have a predetermined thickness, even if an error occurs during the deposition process of the protection metal film.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

The present application claims priority to, and incorporates by reference herein in its entirety, Korean patent application No. 10-2003-0101917, filed on Dec. 31, 2003.

What is claimed is:

1. A method of manufacturing a semiconductor device comprising:
    forming a cobalt film on a wafer including gate, source, and drain regions;
    forming an initial protection metal film with an initial amount of a protection metal film material on the cobalt film;
    thermally treating the wafer to form a cobalt silicide film; and
    forming an additional protection metal film with an additional amount of the protection metal film material on the initial protection metal film,
    wherein forming the additional protection metal film comprises:
    measuring a resistance of the cobalt film and the initial protection metal film;
    determining a thickness of the additional protection metal film to be formed based on the measured resistance;
    determining a time for deposition of the additional amount of the protection metal film material based on the determined thickness; and
    depositing the additional amount of the protection metal film material for the determined time.

2. The method according to claim 1, further comprising:
    disposing the wafer to receive the additional amount of the protection metal film material in a chamber under conditions similar to conditions during which the cobalt film is formed.

3. The method according to claim 1, wherein forming the cobalt film uses one of physical vapor deposition and chemical vapor deposition.

4. The method according to claim 1, wherein forming the initial and additional protection metal film use TiN.

5. The method according to claim 1, wherein one of forming the initial and additional protection metal film uses physical vapor deposition or chemical vapor deposition.

6. The method according to claim 1, wherein thermally treating is performed from about 10 seconds to about 60 seconds, at a temperature from about 300° C. to 600° C., with a rapid thermal process.

7. The method according to claim 1, wherein thermally treating is performed from about 20 seconds to about 60 seconds, at a temperature from about 300° C. to 600° C., with an electric furnace thermal process.

8. The method according to claim 1, further comprising:
    removing the initial protection metal film and non-silicified cobalt film after forming the cobalt film; and
    thermally treating the wafer to stabilize the cobalt silicide film.

9. The method according to claim 2, further comprising:
    plasma treating the cobalt film prior to forming the initial protection metal film.

10. A method of manufacturing a semiconductor device comprising:
    step for forming a cobalt film on a wafer including gate, source, and drain regions;
    step for forming an initial protection metal film with an initial amount of a protection metal film material on the cobalt film;
    step for thermally treating the wafer to form a cobalt silicide film; and
    step for forming an additional protection metal film with an additional amount of the protection metal film material on the initial protection metal film,
    wherein the step for forming the additional protection metal film comprises:
    step for measuring a resistance of the cobalt film and the initial protection metal film;
    step for determining a thickness of the additional protection metal film to be formed based on the measured resistance;
    step for determining a time for deposition of the additional amount of the protection metal film material based on the determined thickness; and
    step for depositing the additional amount of the protection metal film material for the determined time.

11. The method according to claim 10, further comprising:
    step for disposing the wafer to receive the additional amount of the protection metal film material in a chamber under conditions similar to conditions during which the cobalt film is formed.

12. The method according to claim 10, wherein the step for forming the cobalt film uses one of physical vapor deposition and chemical vapor deposition.

13. The method according to claim 10, wherein the steps of forming the initial and additional protection metal film use TiN.

14. The method according to claim 10, wherein one of the steps for forming the initial and additional protection metal film uses physical vapor deposition or chemical vapor deposition.

15. The method according to claim 10, wherein the step for thermally treating is performed from about 10 seconds to about 60 seconds, at a temperature from about 300° C. to 600° C., with a rapid thermal process.

16. The method according to claim 10, wherein the step for thermally treating is performed from about 20 seconds to about 60 seconds, at a temperature from about 300° C. to 600° C., with an electric furnace thermal process.

17. The method according to claim 10, further comprising:

step for removing the initial protection metal film and non-silicified cobalt film after the step for forming the cobalt film; and step for thermally treating the wafer to stabilize the cobalt silicide film.

18. The method according to claim 10, further comprising:

step for plasma treating the cobalt film prior to the step for forming the initial protection metal film.

* * * * *